(12) United States Patent
Zhang et al.

(10) Patent No.: US 11,782,100 B2
(45) Date of Patent: Oct. 10, 2023

(54) FULL-POLARIZATION FARADAY MAGNETIC FIELD SENSOR BASED ON SAGNAC INTERFERENCE SYSTEM AND MODULATION METHOD THEREFOR

(71) Applicant: ZHEJIANG UNIVERSITY, Hangzhou (CN)

(72) Inventors: Dengwei Zhang, Hangzhou (CN); Cui Liang, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 351 days.

(21) Appl. No.: 17/351,162

(22) Filed: Jun. 17, 2021

(65) Prior Publication Data

US 2021/0311135 A1 Oct. 7, 2021

Related U.S. Application Data

(63) Continuation of application No. PCT/CN2020/134181, filed on Dec. 7, 2020.

(51) Int. Cl.
*G01R 33/032* (2006.01)
*G02B 27/28* (2006.01)

(52) U.S. Cl.
CPC ....... *G01R 33/0322* (2013.01); *G02B 27/283* (2013.01)

(58) Field of Classification Search
CPC . G01R 33/022; G01R 33/0011; G02B 27/283
See application file for complete search history.

(56) References Cited

U.S. PATENT DOCUMENTS

| 4,735,506 A * | 4/1988 | Pavlath | G01C 19/726 356/464 |
| 2003/0123064 A1* | 7/2003 | Szafraniec | G01C 19/721 356/460 |

(Continued)

FOREIGN PATENT DOCUMENTS

| CN | 102023287 A | 4/2011 |
| CN | 103344925 A | 10/2013 |

(Continued)

OTHER PUBLICATIONS

International Search Report (PCT/CN2020/134181); dated Mar. 3, 2020.

*Primary Examiner* — Dominic E Hawkins
(74) *Attorney, Agent, or Firm* — W&G Law Group

(57) ABSTRACT

A full-polarization Faraday magnetic field sensor based on a Sagnac interference system and a modulation method are provided. The full-polarization Faraday magnetic field sensor includes a light source, an optical fiber coupler, a polarizer, a polarization beam splitter, a polarization controller, a magnetic field sensing unit, a detector and a polarization maintaining optical fiber. An optical signal is emitted by the light source, passes through the optical fiber coupler and the polarizer in sequence, and is divided into a clockwise path and an anticlockwise path by the polarization beam splitter. Angles between fast axis directions of the two polarization maintaining optical fiber loops and a polarization direction of the polarizer are respectively clockwise 45° and anticlockwise 45°. The two polarization maintaining optical fiber loops has opposite winding directions, a same diameter, and a same number of winding turns.

5 Claims, 2 Drawing Sheets

(56) References Cited

U.S. PATENT DOCUMENTS

2016/0305984 A1* 10/2016 Bohnert ............... G01R 15/245
2019/0234739 A1*  8/2019 Yao .................... G01C 19/04

FOREIGN PATENT DOCUMENTS

| CN | 107515378   A | 12/2017 |
| CN | 109556595   A |  4/2019 |
| CN | 111366881   A |  7/2020 |
| KR | 20190139071 A | 12/2019 |

* cited by examiner

FULL-POLARIZATION FARADAY MAGNETIC FIELD SENSOR BASED ON SAGNAC INTERFERENCE SYSTEM AND MODULATION METHOD THEREFOR

TECHNICAL FIELD

The present application relates to the technical field of optical fiber sensing, and specifically to a full-polarization Faraday magnetic field sensor based on a Sagnac interference system and a modulation method therefor.

BACKGROUND

Traditional magnetic field sensors convert the magnetic field signal into an electrical signal for measurement but are easily interfered by the environmental electromagnetic field, and their theoretical and practical precision is not high. Therefore, fiber optic sensing came into being.

The optical fiber magnetic field sensor uses optical fibers to transmit optical signals to the area to be detected. The optical signal is modulated by the magnetic field to be measured and its specific properties change. Then the detector and signal processing system obtain the characteristics of the magnetic field to be measured. According to different working principles, the current optical fiber magnetic field sensors are mainly divided into four types:

The first type is based on the early M-Z or Michelson interference structure, which uses the external magnetic field changes to cause the magnetic material fixedly connected to the optical fiber or grating to deform by stretching or contraction, which leads to the strain of the optical fiber or grating on the measuring arm. The external magnetic field is measured by measuring the phase change or spectral change of the interferometer. The environmental stability of this sensing method is poor, mainly because M-Z is a non-common dual-beam interference structure, and any non-common mode interference (temperature, vibration, or sound) on the two interference arms can cause a phase shift and polarization instability. In addition, this sensing method cannot measure the vector magnetic field.

The second type is to use an optical fiber microstructure in combination with a magnetic fluid as a sensitive unit. Based on the characteristic that the refractive index of the magnetic fluid changes under the action of the magnetic field, an F-P cavity, M-Z structure or Sagnac structure is used to measure the coherent light intensity or spectrum, and to measure the external magnetic field. The stability of this sensing method is low, because the optical fiber and the magnetic fluid are sensitive to temperature.

The third type is to use the high magneto-optical coefficient of the magneto-optical crystal. When the magnetic field is parallel to the propagation direction of light, the polarization state of the linearly polarized light propagating in the crystal is deflected. The angle of deflection is linearly related to the size of the magnetic field, the magneto-optical coefficient, and the length of the crystal. The magnetic field is measured by measuring the angle of deflection of the polarized light. The traditional sensing method using the magneto-optical crystal Faraday effect has low sensitivity and poor stability. Although the sensitivity can be improved by increasing the length of the magneto-optical crystal, the size of the sensor is increased, failing to meet the miniaturization requirements.

The fourth type is some novel measurement methods, including measuring the phase, optical path, polarization state or refractive index with a functional optical fiber sensor by using technologies based on surface plasmon resonance, based on Lorentz force, based on atomic magnetometer structure, and so on, to achieve the measurement of the external magnetic field. This type of sensing method has low sensitivity and poor stability and bandwidth that cannot be solved, can only be used for scalar measurement, and is not applicable on many occasions.

In addition, the traditional Sagnac Faraday magnetic field sensors usually transmit linearly polarized light on the fast axis and slow axis of the polarization maintaining optical fiber at the same time. The linearly polarized light is converted into left-handed and right-handed circularly polarized light by a quarter wave plate, which are then modulated by an external magnetic field, so that the two beams of circularly polarized light have a phase difference. Afterward, the circularly polarized light is restored to linearly polarized light by a quarter wave plate. The phase difference is detected by the detection system after interference, thus obtaining external magnetic field information. This solution requires the conversion between linearly polarized light and circularly polarized light. Limited by the performance of devices such as wave plates, there are many uncontrollable errors in the conversion process. In addition, the simultaneous transmission of the optical signal through the fast axis and slow axis of the polarization maintaining optical fiber has the problem of mode coupling, leading to a large system error, resulting in low system sensitivity.

SUMMARY

In order to solve the disadvantages of poor stability and low detection accuracy of the existing magnetic field sensors, the present application integrates a Sagnac interference system with high stability and high precision and a magneto-optical crystal with high a magneto-optical coefficient, and proposes a full-polarization Faraday magnetic field sensor based on a Sagnac interference system and a modulation method, which adopt an independent linearly polarized light transmission method. The linearly polarized light transmitted on the fast axis (or slow axis) of a polarization maintaining optical fiber is specially modulated using a polarization controller. After passing through a magnetic field sensing unit, the polarization state of the linearly polarized light changes and polarization interference occurs at the output end. The polarization state change is directly obtained by detecting the light intensity, thus obtaining external magnetic field information. The present application adopts a high-performance polarizing device for improving the stability of the sensor, and at the same time, the sensitivity of the system can be effectively improved by using a magnetic flux aggregator in the magnetic field sensing unit.

To achieve the above object, the present application adopts the following technical solutions:

A full-polarization Faraday magnetic field sensor based on a Sagnac interference system includes a light source, an optical fiber coupler, a polarizer, a polarization beam splitter, a polarization controller, a magnetic field sensing unit, a detector and a polarization maintaining optical fiber. An output port of the light source and a receiving port of the detector are respectively fiber-connected to two ports of the optical fiber coupler on a same side of the optical fiber coupler, a port of the optical fiber coupler on another side of the optical fiber coupler is fiber-connected to the polarizer, and the polarizer is fiber-connected to a port of the polarization beam splitter on a side of the polarization beam splitter. A port of the polarization beam splitter on another side of the polarization beam splitter is fiber-connected to the first polarization maintaining optical fiber loop by the first polarization controller, another port of the polarization beam splitter on the another side of the polarization beam splitter is fiber-connected to the second polarization maintaining optical fiber loop by the second polarization controller, and both the first polarization maintaining optical fiber loop and the second polarization maintaining optical fiber loop are connected to the magnetic field sensing unit. An angle formed between a fast axis direction of the first polarization maintaining optical fiber loop and a polarization direction of the polarizer and an angle formed between a fast axis direction of the second polarization maintaining optical fiber loop and the polarization direction of the polarizer are 45° and have opposite directions, and the fiber-connection adopts a polarization maintaining optical fiber. The magnetic field sensing unit includes a first coupling lens, a first magnetic flux aggregator, a magneto-optical crystal, a second magnetic flux aggregator, and a second coupling lens that are axially arranged in sequence, the first coupling lens and the second coupling lens are symmetric with respect to the magneto-optical crystal, and the first magnetic flux aggregator and the second magnetic flux aggregator are symmetric with respect to the magneto-optical crystal. The first coupling lens is connected to the first polarization maintaining optical fiber loop, and the second coupling lens is connected to the second polarization maintaining optical fiber loop. Two axial through holes are provided in the first magnetic flux aggregator and the second magnetic flux aggregator, respectively, and two end surfaces of the magneto-optical crystal are respectively inserted into the two axial through holes to be fixed. Two light beams respectively outputted from the first polarization maintaining optical fiber loop and the second polarization maintaining optical fiber loop are coupled into the two axial through holes through the first coupling lens and the second coupling lens, respectively.

In an embodiment, the first polarization maintaining optical fiber loop and the second polarization maintaining optical fiber loop are formed by winding of two polarization maintaining optical fibers, and the two polarization maintaining optical fiber loops have a same diameter, a same number of winding turns, and opposite winding directions.

In an embodiment, outer surfaces of the two end surfaces of the magneto-optical crystal are each coated with an anti-reflection film.

In an embodiment, sizes of the two axial through holes in the first magnetic flux aggregator and the second magnetic flux aggregator match a diameter of the magneto-optical crystal.

The present application also discloses a method of optical signal modulation based on the above full-polarization Faraday magnetic field sensor, which is specifically as follows:

1) an optical signal emitted by the light source sequentially passing through the optical fiber coupler, the polarizer, and the polarization beam splitter to be divided into two light beams to be transmitted clockwise and anticlockwise, the two light beams respectively transmitting to the first polarization controller and the second polarization controller through polarization maintaining optical fibers, and using the first polarization controller and the second polarization controller to respectively superpose clockwise 45° polarization modulation and anticlockwise 45° polarization modulations on the two light beams;

2) the modulated light transmitted along a clockwise light path entering a fast axis of the first polarization maintaining optical fiber loop for transmission, converting optical fiber light by the first coupling lens into spatial light, and coupling the spatial light into the axial through hole of the first magnetic flux aggregator; the spatial light sequentially passing through the magneto-optical crystal and the second magnetic flux aggregator, and then being converted by the second coupling lens into optical fiber light that enters a slow axis of the second polarization maintaining optical fiber loop for transmission;

3) the modulated light transmitted along an anticlockwise light path entering a fast axis of the second polarization maintaining optical fiber loop for transmission, converting the optical fiber light by the second coupling lens into spatial light, and coupling the spatial light into the axial through hole of the second magnetic flux aggregator; the spatial light sequentially passing through the magneto-optical crystal and the first magnetic flux aggregator, and then being converted by the first coupling lens into optical fiber light that enters a slow axis of the first polarization maintaining optical fiber loop for transmission; and 4) after passing through the magneto-optical crystal, light transmitted along the clockwise light path and the anticlockwise light path respectively generating Faraday deflection angles that have a same size and opposite directions, and the two light beams respectively transmitting along the fast axis and the slow axis for half an optical path, simultaneously returning to the polarization beam splitter for polarization interference, and then passing through the polarizer and the optical fiber coupler and then the detector acquiring an interference signal.

Beneficial effects of the present application are as follows:

The magnetic field sensor of the present application uses a full-polarization Sagnac system in combination with an efficient magnetic field sensing unit to measure the magnetic field, and has the advantages of large dynamic range, high magnetic field sensitivity, and the like. Specifically:

(1) The magnetic field sensor proposed in the present application adopts the Sagnac interference system, which has the advantages of common-path interference, that is, high stability and small error, compared with the magnetic field measurement method using M-Z structure;

(2) The present application adopts a magneto-optical crystal with a high Verdet constant, which is less susceptible to environmental factors such as temperature and vibration than the magnetic field measurement method using magnetic fluid, and can be used for vector measurement while having a larger dynamic measurement range.

(3) Compared with the traditional Sagnac Faraday magnetic field sensor, the present application has an innovative principle: adopting techniques including separate transmission of linearly polarized light, use of the polarization controller to modulate the optical signal, and direct polarization interference detection, thereby providing better magnetic field sensitivity and system stability.

In the figures: 1. Light source, 2. Optical fiber coupler, 3. Polarizer, 4. Polarization beam splitter, 5. First polarization controller, 6. Polarization maintaining optical fiber loop, 7. Magnetic field sensing unit, 8. Polarization maintaining optical fiber loop, 9. Second polarization controller, 10. Detector, 11. First coupling lens, 12. First magnetic flux aggregator, 13. Magneto-optical crystal, 14. Second magnetic flux aggregator, 15. Second coupling lens.

DESCRIPTION OF EMBODIMENTS

The present application is further described below with reference to drawings and embodiments.

Figure 1:
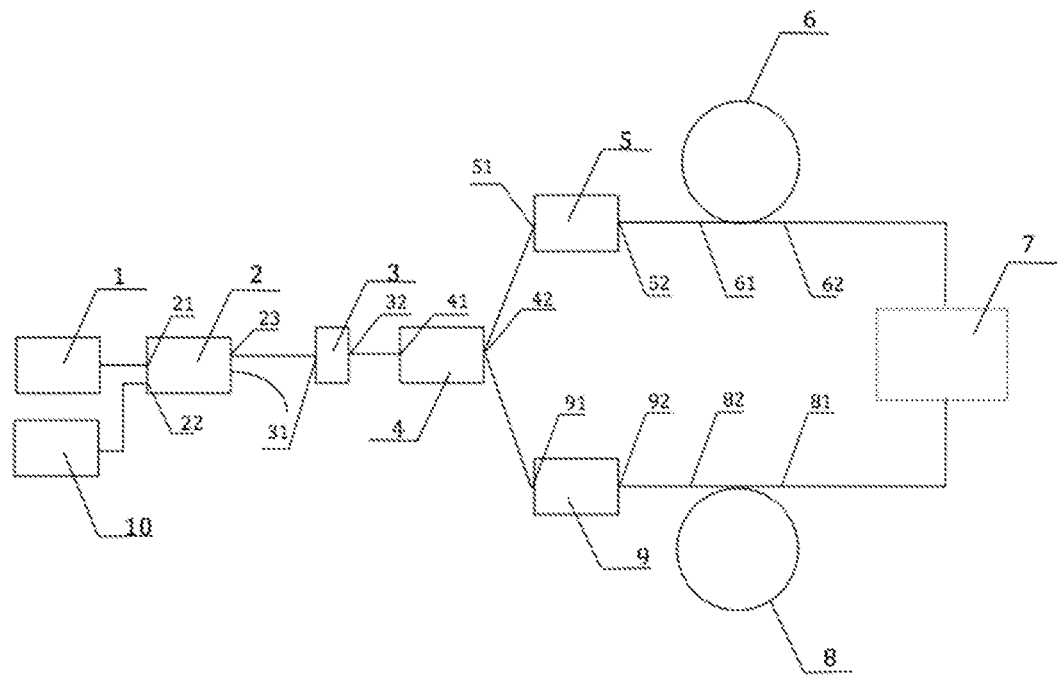
FIG. 1 is a schematic view of a full-polarization Faraday magnetic field sensor based on a Sagnac interference system in the present application.

As shown in FIG. 1, the present application proposes a full-polarization Faraday magnetic field sensor based on a Sagnac interference system, including a light source 1, an optical fiber coupler 2, a polarizer 3, a polarization beam splitter 4, a first polarization controller 5, a second polarization controller 6, a magnetic field sensing unit 7, a detector 10, a first polarization maintaining optical fiber loop 6 and a second polarization maintaining optical fiber loop 8; wherein the light source 1 is connected to a port 21 of the optical fiber coupler 2 by a polarization maintaining optical fiber, a port 22 of the optical fiber coupler 2 is connected to the detector 10 by a polarization maintaining optical fiber, a port 23 of the optical fiber coupler 2 is connected to a port 31 of the polarizer 3 by a polarization maintaining optical fiber, a port 32 of the polarizer 3 is connected to a port 41 of the polarization beam splitter 4 by a polarization maintaining optical fiber, a port 42 of the polarization beam splitter 4 is connected to a port 51 of the first polarization controller 5 by a polarization maintaining optical fiber, a port 52 of the first polarization controller 5 is connected to a port 61 of the first polarization maintaining optical fiber loop 6, and a port 92 of the second polarization controller 9 is connected to a port 82 of the second polarization maintaining optical fiber loop 8. An included angle between a fast axis direction of the first polarization maintaining optical fiber loop 6 and a polarization direction of the polarizer 3 is clockwise 45° (or anticlockwise 45°), and correspondingly an included angle between a fast axis direction of the second polarization maintaining optical fiber loop 8 and the polarization direction of the polarizer 3 is anticlockwise 45° (or clockwise) 45°. That is to say, the fast axis directions of the first polarization maintaining optical fiber loop 6 and the second polarization maintaining optical fiber loop 8 form included angles of 45° with the polarization direction of the polarizer 3, and the included angles are in opposite directions. A port 62 of the first polarization maintaining optical fiber loop 6 and a port 81 of the second polarization maintaining optical fiber loop 8 are respectively connected to two ports of the magnetic field sensing unit 7, and conversion of optical fiber light—spatial light—optical fiber light exists at the magnetic field sensing unit 7. The first polarization maintaining optical fiber loop 6 and the second polarization maintaining optical fiber loop 8 are formed by winding of polarization maintaining optical fibers, and have the same number of turns of the polarization maintaining optical fiber. The two polarization maintaining optical fiber loops have the same diameter. The two polarization maintaining optical fiber loops have opposite winding directions. That is to say, the first polarization maintaining optical fiber loop 6 is wound clockwise (or anticlockwise), and correspondingly the second polarization maintaining optical fiber loop 8 is wound anticlockwise (or clockwise), so as to eliminate the error caused by the Sagnac effect.

Figure 2:
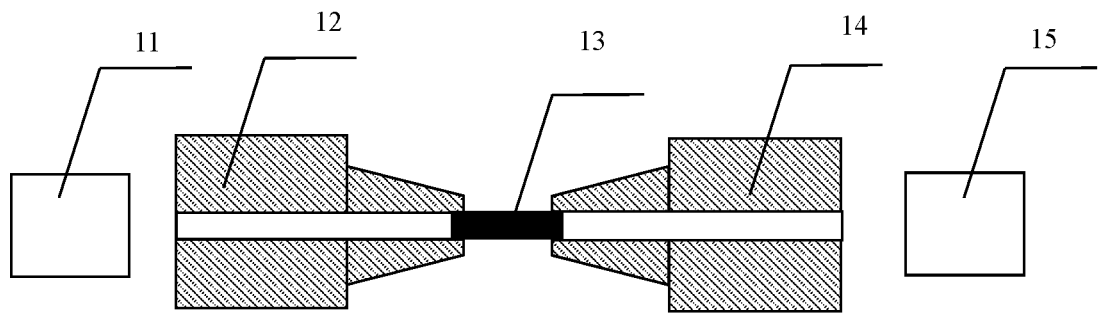
FIG. 2 is a schematic view of a magnetic field sensing unit in the present application.

As shown in FIG. 2, the magnetic field sensing unit 7 mainly includes a coupling lens, a magnetic flux aggregator and a magneto-optical crystal. The left end of the magnetic field sensing unit 7 is connected to the first polarization maintaining optical fiber loop 6 by the first coupling lens 11, and when light on the clockwise light path enters the first coupling lens 11 through the polarization maintaining optical fiber loop 6, the first coupling lens 11 is capable of converting light from the polarization maintaining optical fiber into spatial light, and is also capable of narrowing the light beam so that the light beam is incident on the magneto-optical crystal at a particular angle. The magneto-optical crystal 13 has a high Verdet constant. The first magnetic flux aggregator 12 and the second magnetic flux aggregator 14 are disposed at two ends of the magneto-optical crystal 13, and the two ends of the magneto-optical crystal both partially extend into the axial through hole of the magnetic flux aggregator. The right end of the magnetic field sensing unit 7 is connected to the second polarization maintaining optical fiber loop 8 by the second coupling lens 15, and when light on the clockwise light path exits from the second coupling lens 15, the second coupling lens 15 is capable of converting the spatial light into optical fiber light. Similarly, when the light on the anticlockwise light path enters the magnetic field sensing unit 7 through the second coupling lens 15 and exits from the first coupling lens 11, the second coupling lens 15 is capable of converting light from the polarization maintaining optical fiber into spatial light, and is also capable of narrowing the light beam so that the light beam is incident on the magneto-optical crystal at a particular angle. The first coupling lens 11 is also capable of converting the spatial light into optical fiber light. To sum up, the two coupling lenses have the same function of narrowing incident light, controlling the direction, and coupling the emergent light to an optical fiber.

The working principle of the present application is as follows:

The basic principle of using the Sagnac system for polarization detection is shown in formula (1). It can be seen that the interference output light intensity is related to the polarization angle of the two beams and the phase difference between the two beams. Similar to a gyro, the Sagnac effect needs to obtain phase change information, so it is necessary to adopt various technical means to eliminate the error caused by the polarization state change, mainly various birefringence. The present application takes the polarization rotation caused by the Faraday effect as the target quantity, and suppresses the generation of phase difference by adopting means such as forward and backward encircling rings, so that equivalent detection precision can be obtained in the final detection system.

$$I = I_1 + I_2 + I_{12} = I_1 + I_2 + 2\vec{A_1} \cdot \vec{A_2} \cos \delta = I_1 + I_2 + 2A_1 A_2 \cos 2\theta_F \cos \delta \quad (1)$$

wherein I represents the detected optical signal intensity, $I_1$ and $I_2$ respectively represent intensities of non-interference optical signals transmitted along the clockwise and counterclockwise optical paths, $I_{12}$ represents an intensity of an interference optical signal transmitted along the clockwise and counterclockwise optical paths, $A_1$ and $A_2$ respectively represent amplitudes of optical signals transmitted along the clockwise and counterclockwise optical paths, δ represents a phase difference between the optical signals transmitted along the clockwise and counterclockwise optical paths, and $θ_F$ represents a Faraday deflection angle caused by the magnetic field.

Figure 3:
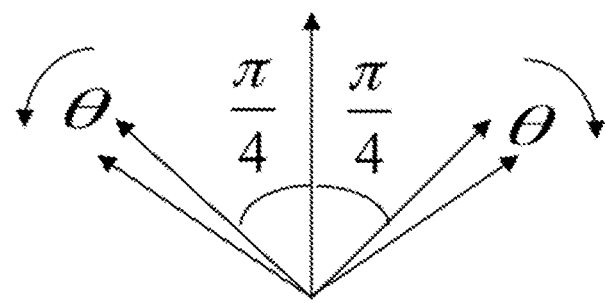
FIG. 3 is a schematic view of the relationship between the polarization states of the optical signal before and after passing through the magnetic field sensing unit and the polarization direction of the polarizer.

In the present application, included angles between the polarization direction of the polarizer and the two main axes of the two polarization maintaining optical fiber loops are respectively clockwise and anticlockwise 45°. After passing through the polarization beam splitter, linearly polarized light is changed into two light beams to be transmitted clockwise and anticlockwise respectively. At the starting end, the polarization controller is used to superpose clockwise 45° and anticlockwise 45° polarization modulations on the light beams, so that the light beams are respectively transmitted along the fast axes of the two polarization maintaining optical fiber loops having opposite winding directions, and after passing through the crystal, respectively generate Faraday deflection angles that are equal in magnitude and opposite in direction. As shown in FIG. 3, after polarization detection and polarization interference, the interference light intensity is obtained from formula (2). It can be seen that at this moment, the interference signal strength has the largest rate of change with respect to the Faraday deflection angle:

$$E_1 = E_2 = E_0 \cos\left(\theta + \frac{\pi}{4}\right) \quad (2)$$

$$I = \langle E_1 * E_2 \rangle = I_0 \cos\left(\theta + \frac{\pi}{4}\right) = \frac{I_0}{2}[1 - \sin(2\theta)]$$

Figure 4:
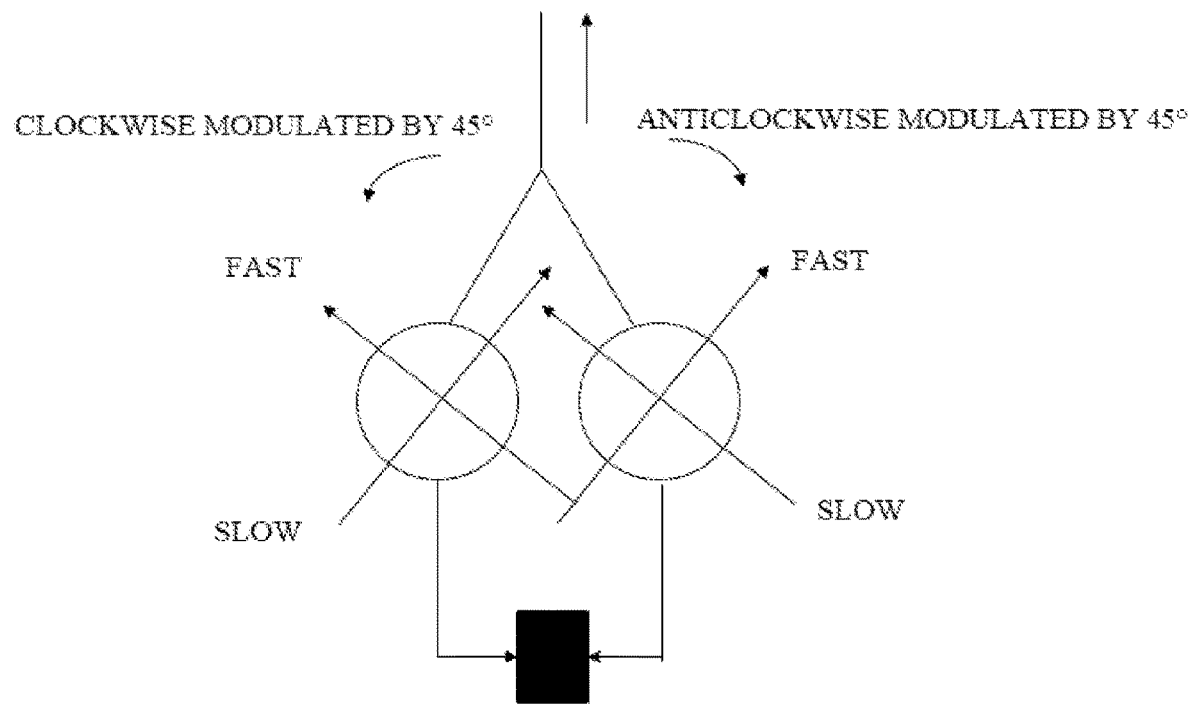
FIG. 4 is a schematic view of the transmission mode of the optical signal before and after passing through the magnetic field sensing unit in the polarization maintaining optical fiber.

In a specific implementation of the present application, light emitted by the light source is divided into two beams after passing through the optical fiber coupler, the polarizer, and the polarization beam splitter. The two beams of linearly polarized light are respectively modulated by a first polarization controller and a second polarization controller. The modulation method is as follows: The first polarization controller 5 and the second polarization controller 9 respectively superpose clockwise 45° and anticlockwise 45° polarization modulations on the two light beams. The modulated two light beams enter two polarization maintaining optical fiber loops that are wound clockwise and anticlockwise respectively. Herein, the first polarization maintaining optical fiber loop on the clockwise light path is wound clockwise, and the second polarization maintaining optical fiber loop on the anticlockwise light path is wound anticlockwise. The two beams of linearly polarized light are respectively transmitted along the fast axes of the two polarization maintaining optical fiber loops before arriving at the magnetic field sensing unit, and after being subjected to conversion of optical fiber light—spatial light—optical fiber light exists at the sensing unit, are respectively coupled into the slow axes of the two polarization maintaining optical fiber loops for transmission, as shown in FIG. 4. In this way, the light transmitted clockwise and anticlockwise is respectively transmitted along the fast axis and the slow axis for half an optical path. The main interference light on the slow axis can reach the exit point at the same time for polarization interference. At this moment, the orthogonal component of polarized light caused by the crystal Faraday effect, which is transmitted along the fast axis, will be a certain distance away from the main interference light at the exit point to ensure that the polarization interference result is not affected.

When the light beam passes through the magnetic field sensing unit, the light transmitted along the fast axis that exits from the port 62 of the first polarization maintaining optical fiber loop 6 is coupled into the axial through hole of the first magnetic flux aggregator 12 through the first coupling lens 11. The first coupling lens 11 converts the optical fiber light into spatial light, and at the same time reduces the diameter of the light beam to several times to tens of times smaller than the diameter of the magneto-optical crystal, and adjusts the light beam to be incident on the left end surface of the magneto-optical crystal. After passing through the magneto-optical crystal, the light beam exits from the right end surface. The second magnetic flux aggregator 14 collects magnetic lines of force, and then the spatial light is coupled into the polarization maintaining optical fiber through the second coupling lens, and enters the slow axis of the second polarization maintaining optical fiber loop 8 for transmission.

Similarly, the light transmitted along the fast axis that exits from the port 81 of the second polarization maintaining optical fiber loop 8 is coupled into the axial through hole of the second magnetic flux aggregator 14 through the second coupling lens 15. The second coupling lens 15 converts the optical fiber light into spatial light, and at the same time reduces the diameter of the light beam to several times to tens of times smaller than the diameter of the magneto-optical crystal, and adjusts the light beam to be incident on the right end surface of the magneto-optical crystal. After passing through the magneto-optical crystal, the light beam exits from the left end surface. The first magnetic flux aggregator 12 collects magnetic lines of force, and then the spatial light is coupled into the polarization maintaining optical fiber through the first coupling lens, and enters the slow axis of the first polarization maintaining optical fiber loop 6 for transmission. When the magnetic field sensing unit is subjected to a magnetic field along the direction of the magneto-optical crystal, the polarized light passing through the magneto-optical crystal is Faraday deflected due to the Faraday effect, which causes a change in the intensity of the polarization interference light. External magnetic field information can be obtained by light intensity detection and information processing.

In this example, a proton exchange Y waveguide with a high polarization extinction ratio is used to realize the functions of the polarizer and the polarization beam splitter. The polarization controller is EOSPACE's lithium niobate electro-optical modulation polarization controller, which can realize the conversion from any input polarization state to any output polarization state through voltage control, and the response time is less than 100 ns. The magneto-optical crystal 12 is a cylindrical Ga:YIG crystal, with a diameter of 1.8 mm, a length of 2.7 mm, and a magneto-optical Verdet constant of 8400 rad/m/T. The magnetic flux aggregator 11 is of a structure including a cylinder and a truncated cone. The cylinder has a diameter of 22 mm and a length of 13 mm. The truncated cone has a diameter of 13 mm at its bottom, a length of 13 mm, a taper angle of 22°, and a through hole diameter of 1.8 mm. The two end surfaces of the magneto-optical crystal 13 extend into the axial through holes on the first magnetic flux aggregator 11 and the second magnetic flux aggregator 14 by a length of 0.3 mm. The material used for making the magnetic flux aggregator is Permalloy 1J85. As proved by simulation and experiments, the magnetic flux aggregator can amplify the environmental magnetic field by 400 times or more.

It is known that the polarization extinction ratio of the polarization maintaining optical fiber in the system is about 40 dB and the polarization extinction ratio of the Y-waveguide is about 60 dB, the corresponding minimum resolvable polarization rotation angle is $\Delta\theta=\arctan(1/10^4)\approx10^{-4}$ rad, and the minimum resolution of the Sagnac interference system is about $10^{-6}$ rad. Therefore, in the case of not considering the reflection enhancement technology in the crystal, the theoretical magnetic field sensitivity of the system is $\Delta T=10^{-4}(\text{rad})/8400\ (\text{rad/m/T})/2.7\ \text{mm}/400\approx11$ nT.

In a specific implementation of the present application, a partial region on an inner surface of the two end surfaces of the magneto-optical crystal may be coated with a total reflection film, and a reflection cavity may be formed inside the magneto-optical crystal, so that the light beam is incident on the magneto-optical crystal at a certain angle, and exits after multiple reflections to increase the optical path. According to the principle of the Faraday effect, the change in the polarization state of the optical signal can linearly accumulate with the increase of the optical length, so the magnetic field sensitivity of the system can be effectively improved.

The novel magnetic field sensor proposed in the present application has the advantages of large dynamic range, high stability, high magnetic field sensitivity, being easy to miniaturize, etc., and has broad application prospects in both civil and military fields.

The above-mentioned embodiments are only a preferred solution of the present application, but are not intended to limit the present application. A person of ordinary skill in the art can make various changes and modifications without departing from the spirit and scope of the present application, all of which fall within the protection scope of the present application.

What is claimed is:

1. A full-polarization Faraday magnetic field sensor based on a Sagnac interference system, comprising a light source (1), an optical fiber coupler (2), a polarizer (3), a polarization beam splitter (4), a first polarization controller (5), a second polarization controller (9), a magnetic field sensing unit (7), a detector (10), a first polarization maintaining optical fiber loop (6) and a second polarization maintaining optical fiber loop (8); wherein an output port of the light source (1) and a receiving port of the detector (10) are respectively fiber-connected to two ports of the optical fiber coupler (2) on a same side of the optical fiber coupler (2), a port of the optical fiber coupler (2) on another side of the optical fiber coupler (2) is fiber-connected to the polarizer (3), and the polarizer (3) is fiber-connected to a port of the polarization beam splitter (4) on a side of the polarization beam splitter (4); a port of the polarization beam splitter (4) on another side of the polarization beam splitter (4) is fiber-connected to the first polarization maintaining optical fiber loop (6) by the first polarization controller (5), another port of the polarization beam splitter (4) on the another side of the polarization beam splitter (4) is fiber-connected to the second polarization maintaining optical fiber loop (8) by the second polarization controller (9), and both the first polarization maintaining optical fiber loop (6) and the second polarization maintaining optical fiber loop (8) are connected to the magnetic field sensing unit (7);

an angle formed between a fast axis direction of the first polarization maintaining optical fiber loop (6) and a polarization direction of the polarizer (3) and an angle formed between a fast axis direction of the second polarization maintaining optical fiber loop (8) and the polarization direction of the polarizer (3) are 45° and have opposite directions, and the fiber-connection adopts a polarization maintaining optical fiber;

the magnetic field sensing unit (7) comprises a first coupling lens (11), a first magnetic flux aggregator (12), a magneto-optical crystal (13), a second magnetic flux aggregator (14), and a second coupling lens (15) that are axially arranged in sequence, the first coupling lens (11) and the second coupling lens (15) are symmetric with respect to the magneto-optical crystal (13), and the first magnetic flux aggregator (12) and the second magnetic flux aggregator (14) are symmetric with respect to the magneto-optical crystal (13);

the first coupling lens (11) is connected to the first polarization maintaining optical fiber loop (6), and the second coupling lens (15) is connected to the second polarization maintaining optical fiber loop (8); two axial through holes are provided in the first magnetic flux aggregator (12) and the second magnetic flux aggregator (14), respectively, and two end surfaces of the magneto-optical crystal (13) are respectively inserted into the two axial through holes to be fixed; and two light beams respectively outputted from the first polarization maintaining optical fiber loop (6) and the second polarization maintaining optical fiber loop (8) are coupled into the two axial through holes through the first coupling lens (11) and the second coupling lens (15), respectively.

2. The full-polarization Faraday magnetic field sensor based on the Sagnac interference system according to claim 1, wherein the first polarization maintaining optical fiber loop (6) and the second polarization maintaining optical fiber loop (8) are formed by winding of two polarization maintaining optical fibers, and the two polarization maintaining optical fiber loops have a same diameter, a same number of winding turns, and opposite winding directions.

3. The full-polarization Faraday magnetic field sensor based on the Sagnac interference system according to claim 1, wherein outer surfaces of the two end surfaces of the magneto-optical crystal (13) are each coated with an anti-reflection film.

4. The full-polarization Faraday magnetic field sensor based on the Sagnac interference system according to claim 1, wherein sizes of the two axial through holes in the first magnetic flux aggregator (12) and the second magnetic flux aggregator (14) match a diameter of the magneto-optical crystal (13).

5. A method of optical signal modulation based on the full-polarization Faraday magnetic field sensor according to claim 1, comprising following steps:

1) An optical signal emitted by the light source (1) sequentially passing through the optical fiber coupler (2), the polarizer (3), and the polarization beam splitter (4) to be divided into two light beams to be transmitted clockwise and anticlockwise, the two light beams respectively transmitting to the first polarization controller (5) and the second polarization controller (9) through polarization maintaining optical fibers, and using the first polarization controller (5) and the second polarization controller (9) to respectively superpose clockwise 45° polarization modulation and anticlockwise 45° polarization modulation on the two light beams;

2) The modulated light transmitted along a clockwise light path entering a fast axis of the first polarization maintaining optical fiber loop (6) for transmission, converting optical fiber light by the first coupling lens (11) into spatial light, and coupling the spatial light into the axial through hole of the first magnetic flux aggregator (12); the spatial light sequentially passing through the magneto-optical crystal (13) and the second magnetic flux aggregator (14), and then being converted by the second coupling lens (15) into optical fiber light that enters a slow axis of the second polarization maintaining optical fiber loop (8) for transmission;

3) the modulated light transmitted along an anticlockwise light path entering a fast axis of the second polarization maintaining optical fiber loop (8) for transmission, converting the optical fiber light by the second coupling lens (15) into spatial light, and coupling the spatial light into the axial through hole of the second magnetic flux aggregator (14); the spatial light sequentially passing through the magneto-optical crystal (13) and the first magnetic flux aggregator (12), and then being converted by the first coupling lens (11) into optical fiber light that enters a slow axis of the first polarization maintaining optical fiber loop (6) for transmission; and 4) After passing through the magneto-optical crystal (13), light transmitted along the clockwise light path and the anticlockwise light path respectively generating Faraday deflection angles that have a same size and opposite directions, and the two light beams respectively transmitting along the fast axis and the slow axis for half an optical path, simultaneously returning to the polarization beam splitter (4) for polarization interference, and then passing through the polarizer (3) and the optical fiber coupler (2) and then the detector (10) acquiring an interference signal.

\* \* \* \* \*